United States Patent
Shany et al.

(10) Patent No.: US 9,690,512 B2
(45) Date of Patent: Jun. 27, 2017

(54) METHOD OF SIMILARITY TESTING BY SYNDROMES AND APPARATUS THEREFORE

(71) Applicant: SAMSUNG ELECTRONICS CO., LTD., Suwon-si, Gyeonggi-Do (KR)

(72) Inventors: Yaron Shany, Ramat Gan (IL); Avner Dor, Ramat Gan (IL); Elona Erez, Ramat Gan (IL); Jun Jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 22 days.

(21) Appl. No.: 14/949,458

(22) Filed: Nov. 23, 2015

(65) Prior Publication Data

US 2017/0149451 A1 May 25, 2017

(51) Int. Cl.

| G06F 3/06 | (2006.01) |
|---|---|
| H03M 13/15 | (2006.01) |
| H03M 13/00 | (2006.01) |
| H03M 13/19 | (2006.01) |
| G06F 11/14 | (2006.01) |
| G06F 17/30 | (2006.01) |

(52) U.S. Cl.
CPC ........ *G06F 3/0641* (2013.01); *G06F 11/1453* (2013.01); *H03M 13/1525* (2013.01); *H03M 13/19* (2013.01); *H03M 13/611* (2013.01); *G06F 3/0608* (2013.01); *G06F 17/30156* (2013.01)

(58) Field of Classification Search
CPC .............. G06F 3/0641; G06F 11/1453; G06F 17/30156; G06F 3/0608; H03M 13/1525; H03M 13/611; H03M 13/19
See application file for complete search history.

(56) References Cited

U.S. PATENT DOCUMENTS

| 6,578,031 B1 * | 6/2003 | Washizawa ......... G06F 17/3069 |
|---|---|---|
| 7,702,683 B1 | 4/2010 | Kirshenbaum |
| 7,865,505 B2 | 1/2011 | Arasu et al. |
| 8,224,849 B2 | 7/2012 | Li et al. |

(Continued)

OTHER PUBLICATIONS

C. Constantinescu, J. Glider and D. Chambliss, "Mixing Deduplication and Compression on Active Data Sets," 2011 Data Compression Conference, Snowbird, UT, 2011, pp. 393-402.*

(Continued)

*Primary Examiner* — Cynthia Britt
(74) *Attorney, Agent, or Firm* — Volentine & Whitt, PLLC

(57) ABSTRACT

A method, executed by a processor, for determining similarity between messages includes calculating a syndrome of each of first and second messages with respect to a linear code. A difference between the syndromes of the first and second messages is calculated, and a vector that minimizes a metric in a coset defined by the syndrome difference is identified. A compact representation of the second message that is based upon the first message is generated when a metric of the identified vector is less than or equal to a predetermined threshold. The compact representation of the second message is stored in a location of a memory device assigned for storing the second message, when the metric of the identified vector is less than or equal to the predetermined threshold.

20 Claims, 4 Drawing Sheets

(56) References Cited

U.S. PATENT DOCUMENTS

| | | |
|---|---|---|
| 8,275,782 B2 | 9/2012 | Hirsch et al. |
| 8,280,839 B2 | 10/2012 | Ivanov et al. |
| 2005/0219075 A1* | 10/2005 | Storer ............... H03M 7/3086 341/51 |
| 2010/0037118 A1 | 2/2010 | Saliba et al. |
| 2011/0055471 A1 | 3/2011 | Thatcher et al. |
| 2011/0276744 A1 | 11/2011 | Sengupta et al. |
| 2012/0131005 A1 | 5/2012 | Shen et al. |
| 2012/0198139 A1 | 8/2012 | Tanaka et al. |
| 2012/0260021 A1 | 10/2012 | Rudelic |
| 2013/0138883 A1* | 5/2013 | Haustein ............... G06F 3/0605 711/115 |
| 2013/0262422 A1* | 10/2013 | Bates ................. G06F 11/1004 707/699 |
| 2016/0092552 A1* | 3/2016 | Morfonios ........ G06F 17/30091 707/737 |
| 2016/0232195 A1* | 8/2016 | Davis ............... G06F 17/30371 |

OTHER PUBLICATIONS

H. Li, "Flash Saver: Save the Flash-Based Solid State Drives through Deduplication and Delta-encoding," 2012 13th International Conference on Parallel and Distributed Computing, Applications and Technologies, Beijing, 2012, pp. 436-441.*

* cited by examiner

METHOD OF SIMILARITY TESTING BY SYNDROMES AND APPARATUS THEREFORE

BACKGROUND

1. Technical Field

The present disclosure relates to similarity testing by syndromes and decoding.

2. Description of the Related Art

Oftentimes, a memory receives a request to store a message identical to another message that is already stored by the memory. Storing multiple copies of the same message is wasteful of the memory space in that less space is available for storing differing messages. One method for eliminating the storage of multiple copies of the same message involves identifying the identical messages and substituting a pointer to a stored copy of the message for a message that is received with a request for its storage. A cyclic redundancy code (CRC) check may be applied to each of the messages stored in memory and the message received for storage to determine whether the received message is identical to a stored message.

For example, a hash function converts each stored sector within the memory to parity bits using a systematic encoding for a high-rate cyclic redundancy code. A new arriving sector is considered potentially identical to a previously-stored sector if the hash value (i.e., value of the parity bits) of the arriving sector is equal to that of a previously-stored sector.

Although the application of the CRC check to each of the stored messages (e.g., sectors) and an arriving message is useful for identifying and reducing the storage of identical messages, such is not suitable for similarity testing. More specifically, the CRC check described above does not identify messages that are similar but not identical.

To overcome this deficiency, similarity testing may be achieved by locality sensitive hashing (LSH), defined in P. Indyk and R. Motwani, "Approximate nearest neighbors: Towards removing the curse of dimensionality," STOC 1998: 604-613. The simplest example of LSH is randomly choosing a single bit. Such similarity testing assures that for two length-n messages of Hamming distance $\leq d$, the probability of missing the similarity is $\leq d/n$, while for two messages of distance $\geq (1+e)d$, the probability of falsely declaring similarity is $\leq 1-(1+e)d/n$. See, e.g., Prop. 4 in the above paper of Indyk and Motwani, The performance of single bit sampling can be improved as follows. First, the probability of false positive may be decreased by repeating the bit sampling process $\ell$ times, and declaring similarity when there is a bit-by-bit agreement between the two sequences of $\ell$ hash bits from two messages. Alternatively, the false negative probability may be decreased by declaring similarity if the two $\ell$-bit hashes agree in at least a single coordinate. Combining these two methods, one can find a quite good tradeoff between false positive, false negative, and hash size (number of hash bits).

However, with LSH, the probability of a false detection of similarity may be too high, unless the number of hash bits is very large. Also, hardware limitations might dictate supporting similarity within some small fixed Hamming distance d and a very low false-detection probability is desirable from a Hamming distance of d+1.

SUMMARY

An example embodiment of the disclosure provides a method, executed by a processor, for determining similarity between messages. The method includes calculating a syndrome of each of first and second messages with respect to a linear code; calculating a difference between the syndromes of the first and second messages; identifying a vector that minimizes a metric in a coset defined by the syndrome difference; generating a compact representation of the second message that is based upon the first message, when a metric of the identified vector is less than or equal to a predetermined threshold; and storing in a location of a memory device assigned for storing the second message, when the metric of the identified vector is less than or equal to the predetermined threshold, the compact representation of the second message.

The compact representation of the second message may include a pointer to a storage location of the first message within the memory device.

The compact representation of the second message may include information identifying a difference between the first and second messages.

The information identifying the difference between the first and second messages may be a set of indices identifying locations in which the second message differs from the first message.

The information identifying the difference between the first and second messages may be compressed by a compression algorithm prior to being stored in the memory location assigned for storing the second message.

The metric in the coset defined by the syndrome difference may be a Hamming weight.

The metric in the coset defined by the syndrome difference may be a burst length.

The code may be a Reed-Solomon code.

The code may be a Bose-Chaudhuri-Hocquenghem (BCH) code or Reed-Muller code.

Another example embodiment provides an apparatus for executing de-duplication of similar messages. The apparatus includes a memory that stores messages, including a first message, and a memory controller. The memory controller: calculates a syndrome of each of the first message and a second message with respect to a linear code; calculates a difference between the syndromes of the first and second messages; identifies a vector that minimizes a metric in a coset defined by the syndrome difference; and stores in a location of the memory assigned for storing the second message, when the metric of the identified vector is less than or equal to a predetermined threshold, a compact representation of the second message that is based upon the first message.

The compact representation of the second message may include a pointer to a storage location of the first message within the memory.

The compact representation of the second message may include information identifying a difference between the first and second messages.

The information identifying the difference between the first and second messages may be a set of indices identifying locations in which the second message differs from the first message.

The information identifying the difference between the first and second messages may be compressed by a compression algorithm prior to being stored in the memory location assigned for storing the second message.

The metric in the coset defined by the syndrome difference may be a Hamming weight.

The metric in the coset defined by the syndrome difference may be a burst length.

The code may be a Reed-Solomon code.

The code may be a Bose-Chaudhuri-Hocquenghem (BCH) code or Reed-Muller code.

Another example embodiment of the disclosure provides a method, executed by a processor, for determining similarity between messages, each of the messages having N sub-components. The method includes: a) calculating, for each value of $1 \leq j \leq N$, a syndrome of each of a jth sub-component of a kth first message and a jth sub-component of a second message with respect to a linear code, wherein N is an integer greater than one, j is an integer, and k is an integer greater than zero; b) calculating, for each value of $1 \leq j \leq N$, a jth difference between the syndromes of the jth sub-component of the kth first message and the jth sub-component of the second message; c) identifying, for each value of $1 \leq j \leq N$, a jth vector that minimizes a metric in a coset defined by the jth syndrome difference for the kth first message; d) identifying, for each value of $1 \leq j \leq N$, the jth sub-component of the kth first message and the jth sub-component of the second message as being similar when a metric of the jth vector is less than or equal to a first predetermined threshold; e) identifying the $k^{th}$ first message and the second message as being similar when the number of sub-components identified as being similar between the $k^{th}$ first message and the second message exceeds a second predetermined threshold; f) generating a compact representation of the second message that is based upon the kth first message, when the kth first message and second message are identified as being similar and satisfy a predetermined degree of similarity; and g) storing in a location of a memory assigned for storing the second message, when the kth first message and second message are identified as being similar and satisfy the predetermined degree of similarity, the compact representation of the second message.

The method may further include: performing operations (a) through (e) for each of k>1 first messages, wherein the kth first message and the second message satisfy the predetermined degree of similarity when the kth first message is no less similar to the second message than any of the other k-1 first messages.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION OF EMBODIMENTS

Figure 1:
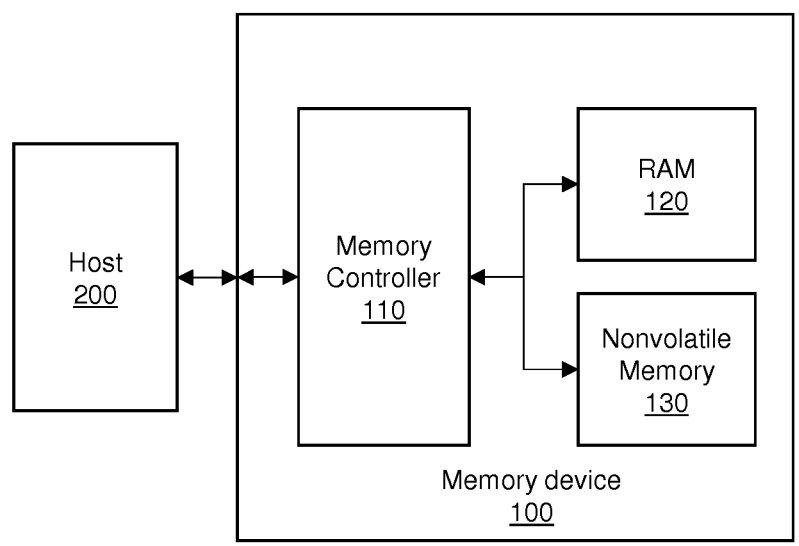
FIG. 1 illustrates a system that de-duplicates messages stored to a nonvolatile memory.

The advantages and features of the present disclosure and methods of achieving them will be apparent from the following example embodiments that will be described in more detail with reference to the accompanying drawings. It should be noted, however, that the present disclosure is not limited to the following example embodiments, and may be implemented in various forms. Accordingly, the example embodiments are provided for representation and explanation of the present disclosure and let those skilled in the art know the concept of the present disclosure.

The terms used in the present disclosure are for the purpose of describing particular embodiments only and are not intended to be limiting of the present disclosure. As used in the specification, the singular forms "a", "an" and "the" are intended to include the plural forms as well, unless the context clearly indicates otherwise. It will be further understood that the terms "comprises" and/or "comprising", when used in the present disclosure, specify the presence of stated features, integers, steps, operations, elements, and/or components, but do not preclude the presence or addition of one or more other features, integers, steps, operations, elements, components, and/or groups thereof.

Hereinafter, example embodiments of the present disclosure will now be described more fully with reference to the accompanying drawings.

The above-described limitations of the related art may be overcome as follows. To detect a Hamming distance of up to s, use syndromes of a t-error correcting code with t>s. Let C be a binary linear code of length n, dimension k and Hamming distance at least 2t+1, and let H be a parity check matrix for C (an (n-k)×n matrix). Given a message x of length n (e.g., a sector), the hash value for x is Hash (x)=H·x (a vector of length n-k).

The similarity between a new message y of length n and the previous message x, whose hash value is h=Hash(x) =H·x, is determined as follows. First, using only the available data, which is y and h, calculate $\Delta = H \cdot y - h = H \cdot (y-x)$, where $\Delta$ is the syndrome of the difference y-x. Second, use a (bounded-distance) decoder of C to find the lowest-weight vector in the coset defined by the syndrome $\Delta$. This lowest-weight vector is the error vector. Third, if the Hamming weight of the error vector is $\leq s$, then declare that x and y are similar. On the other hand, if the weight of the error vector is >s or if the bounded-distance decoder fails, then declare that x and y are not similar.

For t>s, a similarity (i.e., Hamming distance) of s or less is always detected. Different choices of t (>s) provide a tradeoff between small hash size and low probability of false detection (the larger t, the smaller the false detection probability and the larger the hash size).

A tradeoff between hash size and computational complexity of the new similarity test may be achieved by a proper choice of the linear code. For example, Reed-Muller codes typically have a larger co-dimension (that is, the number of bits in a syndrome) than Bose-Chaudhuri-Hocquenghem (BCH) codes with the same minimum distance, but have a very simple decoding algorithm, namely, majority logic decoding (see e.g., Ch. 13 of F. J. MacWilliams and N. J. A. Sloane, The Theory of Error-Correcting Codes, North Holland, 1977). So, moving from BCH codes to Reed-Muller codes will decrease the computational complexity of decoding, at the cost of more hash bits.

In an exemplary embodiment of the disclosure, a double-error correcting BCH code is used for detecting a Hamming distance of $\leq 1$. In the example, t=2 and s=1, which is useful for memory sectors that differ by one bit. Suppose the code length is $n=2^m-1$, for a hash size of 2 m bits per sector. For primitive $\alpha \in K = F_2^m$, the check matrix is:

$$H = \begin{pmatrix} 1 & \alpha & \alpha^2 & \dots & \alpha^{n-1} \\ 1 & \alpha^3 & \alpha^{3 \cdot 2} & \dots & \alpha^{3 \cdot (n-1)} \end{pmatrix}.$$

If the syndrome difference between a new sector and a stored sector is $(y,y')^T$ (where $(\cdot)^T$ stands for transposition) for some y,y' in K, then: (1) declare identity if and only if (iff) y'=y=0 and (2) declare similarity (Hamming distance 1) if and only if y'=y³. In this exemplary embodiment, a Hamming distance of 1 or less is always detected. When the sector difference is chosen randomly at weight w, a false detection occurs with zero probability for $2 \leq w \leq 3$. The probability of a false detection for weights of 4 or more is discussed below.

For weight $w \geq 4$, the number $N_w$ of words of weight w and distance at most 1 from C is given by $N_w = A_w + (n-w+1)A_{w-1} + (w+1)A_{w+1}$, where $A_w$ is the number of codewords of weight w in C. Dividing by $$\binom{n}{w}$$

to get the percentage of these words, in the set of all words of weight w, produces (with some rearrangement of terms):

$$\frac{N_w}{\binom{n}{w}} = \frac{A_w}{\binom{n}{w}} + w \frac{A_{w-1}}{\binom{n}{w-1}} + (n-w) \frac{A_{w+1}}{\binom{n}{w+1}}. \quad \text{–equation 1}$$

Because for large enough m, say, m=15, the weight distribution of the double-error correcting BCH code of length $2^m - 1$ is binomial up to a negligible error, all the ratios on the right side of equation 1 are equal to $1/2^{n-k} = 1/2^{2m}$, up to a negligible error. Thus, for $w \geq 4$, the probability of falsely declaring similarity is very close to $(n+1)/2^{2m} = 1/2^m$, for m large enough.

A comparison of the identity test with the similarity test produces the following. For an identity test employing m-bits of hash, the probability of falsely declaring identity for each non-zero distance is $\leq 1/2^m$. For a similarity test employing 2m-bits of hash, a similarity of distance $\leq 1$ is surely detected (i.e., a probability of 1) and the probability of falsely declaring similarity is $\leq \sim 1/2^m$.

The similarity test described herein works also for non-binary codes (over any finite field), such as Reed-Solomon codes, Hermitian codes, etc., and is useful for messages that tend to differ on bytes, chunks of 16 bits, etc. For example, Reed-Solomon codes over an alphabet of bytes (more precisely, the alphabet is $F_2^8$) may be used for messages of length up to 256 bytes. However, Reed-Solomon codes may also be used for longer sectors, e.g., by dividing a sector into chunks of 256 bytes and working with such chunks instead of sectors for deduplication in the following way. Two long (e.g., >256 bytes) sectors may be considered similar if all their 256-bytes chunks are similar according to the above bounded distance decoding method, or, more generally, if at least w chunks (where the threshold w is a design parameter) are similar according to the above bounded distance decoding method. Note that this results in two design parameters for defining similarity—the maximum allowed Hamming distance within a chunk, and the minimum allowed number of similar chunks in a sector. Yet another alternative for handling long sectors is to work with codes whose length is larger than the field over which they are defined. This includes subfield subcodes (e.g., binary and non-binary BCH codes), and algebraic-geometry codes. For example, Hermitian codes over $F_2^8$ have a length of $((256)^{0.5})^3 = 4096$ bytes, which is a common value for the number of bytes in a sector. Thus, the Hermitian codes are highly suitable for a sector, but require a bounded-distance decoder. For de-duplication, this is useful for data with many sectors that differ by a few bytes. Another common case, sectors that differ on a short enough burst.

The above-described similarity test may be used with codes for burst error correction, such as for detecting whether the difference between two sectors is a burst of length $\leq s$. In this instance, a code capable of correcting bursts of length t, t>s (e.g., a Fire code) is appropriate. A tradeoff between the hash size and the probability of miss-detection exists for different values of t, t>s.

As the similarity test may be applied to de-duplication, suppose that different sectors to be stored in memory differ by s bits or less. Incoming sectors are hashed as described above. That is, for each arriving sector x, the syndrome Hx is calculated, where H is the parity check matrix of a t-error correcting code with t>s.

A table in random access memory (RAM) stores hash values calculated for N previously-incoming sectors. Sectors, whose hash values are stored in RAM, may be stored in a flash memory, for example. In a typical application, sectors whose hash values are stored in the table are "hot" sectors, that is, sectors which tend to be duplicated, or nearly duplicated (that is, duplicated up to a small difference). The hash value of the incoming sector is compared for similarity to some or all of the hash values stored in RAM, so as to reach a first-stage determination of similarity between the incoming sector and one stored in the flash memory. Such first-stage comparison is accomplished without reading one or more sectors from the flash memory.

If similarity is found for some hash values from the table, it is possible, for example, to pick one hash value with the "best" similarity (where "best" may mean, for example, smallest Hamming distance, or shortest burst length). The arriving sector is then compared to the stored sector corresponding to the best hash. If the actual distance is larger than allowed (false detection), continue to the "second best" similar hash, etc. (up to a pre-defined maximum).

If a true similarity is found, the new arriving sector may be stored compactly by the pair consisting of: (1) a pointer to the similar sector and (2) the set of up to s-bit indices on which the new sector differs from the stored sector (for the case where similarity is in the sense of having a Hamming distance of up to s bits). For additional space saving, this set of bit indices can be efficiently compressed.

FIG. 1 illustrates a system that de-duplicates messages stored in a nonvolatile memory. The system includes a memory device 100 and a host 200. Memory device 100 includes a memory controller 110, a random access memory (RAM) 120, and a nonvolatile memory 130.

Memory controller 110 receives messages from host 200 for storage in nonvolatile memory 130 and conveys messages stored by nonvolatile memory 130 to host 200 upon request by host 200. Memory controller 110 calculates the hash value of each message received from host 200, as described above. The calculated hash values may be communicated by memory controller 110 to RAM 120 for storage in a deduplication table and retrieved from RAM 120 by memory controller 110.

In an exemplary embodiment, the deduplication table has 1024 entries and each entry includes a logical address of a message stored in nonvolatile memory 130 and a syndrome corresponding to the message. In this embodiment, the message is the data stored in a sector identified by the logical address.

For each incoming message received from host 200, memory controller 110 calculates the hash of the incoming message and compares the hash value of this message to the hash values of previously-received messages whose hash values are retrieved from RAM 120. For one or more of the hash values stored in RAM 120 identified as having similar values to the hash of the incoming message, memory controller 110 compares the incoming message to the one or more messages corresponding to the identified one or more similar hash values.

If a true similarity is found, memory controller 110 stores within nonvolatile memory 130, at a location reserved for the incoming message: (1) a pointer to the similar message already stored in nonvolatile memory 130 and (2) information of how the incoming message differs from the similar, stored message. The pointer may be a logical address of the similar message already stored in nonvolatile memory. For additional space saving, the information of how the incoming message differs from the similar, stored message may be compressed. If true similarity is not found, then memory controller may store the message in nonvolatile memory 130.

Figure 2:
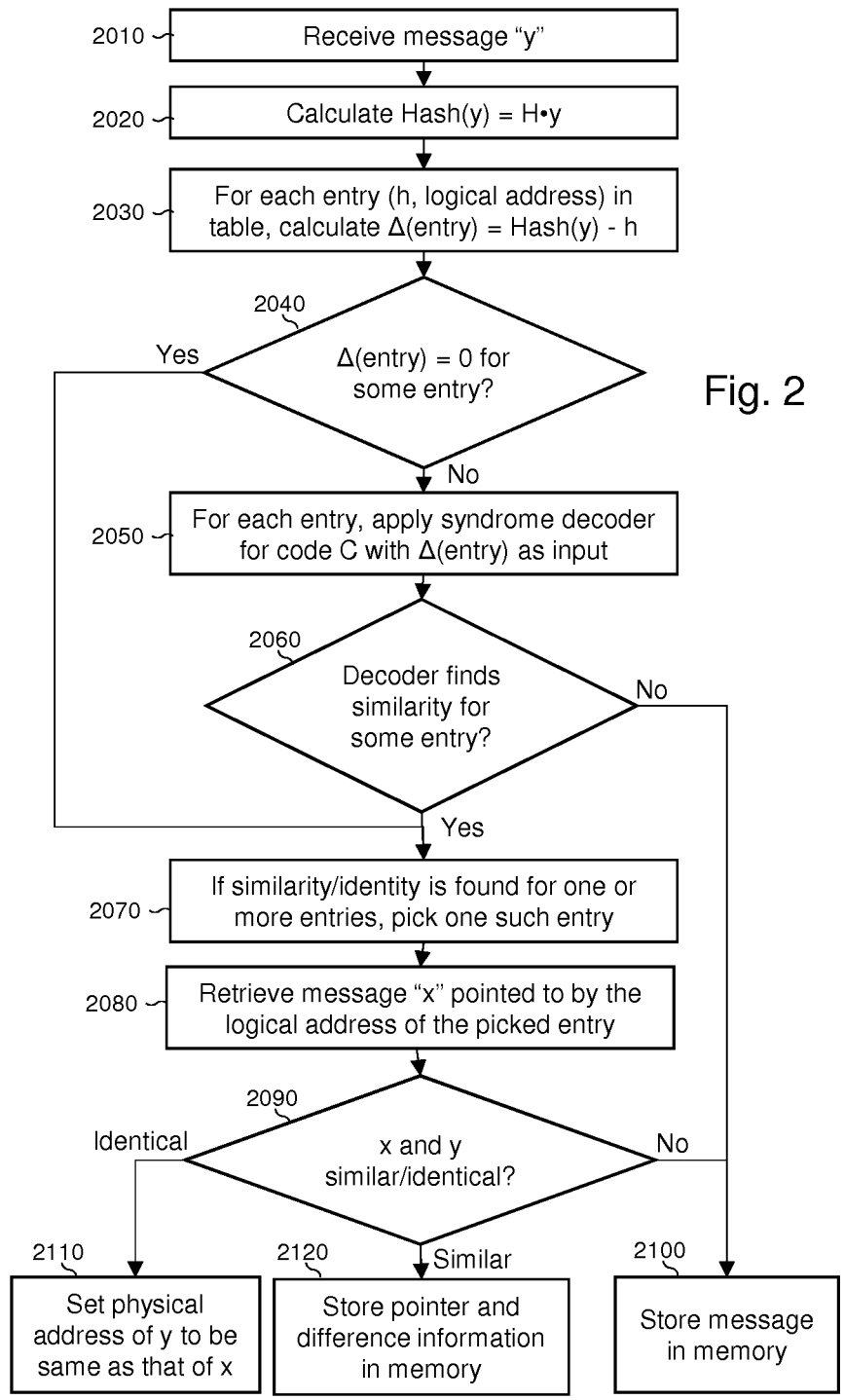
FIG. 2 illustrates a method for identifying similar messages in accordance with an embodiment of the disclosure.

FIG. 2 illustrates a method for identifying similar messages in accordance with an embodiment of the disclosure. This method may be executed by memory controller 110, illustrated in FIG. 1.

Memory controller 110 receives 2010 a message "y" and a logical address from host 200. In an exemplary embodiment, message y is a sector of data to be stored in nonvolatile memory 130 at a location identified by the logical address. In another embodiment, message y is a portion of the sector.

Memory controller 110 calculates 2020 a hash of message y, expressed as Hash(y). For each entry (e.g., the pair (h, logical address)) within the deduplication table stored in RAM 120, memory controller 110 calculates 2030 $\Delta(entry)=Hash(y)-h$, where h is the hash of the message at the logical address.

In an exemplary embodiment, the difference Hash(y)−h is obtained by a bit-by-bit XOR operation between syndrome Hash(y) and syndrome h. In another exemplary embodiment, the deduplication table has 1024 entries and each entry includes a logical address of a message stored in nonvolatile memory 130 and a syndrome corresponding to the message. In this embodiment, the message is the data stored in a sector identified by the logical address.

Memory controller 110 determines 2040 whether $\Delta(entry)=0$ for a particular entry within the deduplication table. If a difference value of zero is identified for an entry of the deduplication table, memory controller 110 deems the message identified by the entry to be prospectively identical to the received message y and proceeds directly to operation 2070. Otherwise, memory controller 110 individually applies 2050 each calculated $\Delta(entry)$ as an input to a syndrome decoder for the code C. The syndrome decoder identifies the lowest-weight word in the coset corresponding to the syndrome difference.

Memory controller 110 determines 2060 whether the syndrome decoder identifies similarity between the message y and the message(s) corresponding to one or more syndrome differences $\Delta(entry)$. If memory controller 110 determines 2060 that none of the messages corresponding to the entries of the deduplication table are similar to message y, memory controller stores 2100 message y in nonvolatile memory 130.

If the lowest weight word output by the syndrome decoder is less than the error-correcting radius, t, of code C, this lowest-weight word is called the error. In an exemplary embodiment, the error-correcting radius t is at least 4. In this embodiment, similarity is identified for an error having a weight of 3 or less.

Among the deduplication table entries (e.g., pairs (h, logical address)) whose corresponding messages memory controller 110 identifies as similar or deems prospectively identical to the received message y, memory controller 110 selects 2070 one of the messages, message x, for further comparison. In an exemplary embodiment, memory controller 110 selects an entry whose corresponding message has the lowest identified error weight.

Memory controller 110 retrieves 2080 from nonvolatile memory 130 the message x selected in operation 2070 using the logical address of the message identified in the deduplication table. Memory controller 110 compares the retrieved message x and received message y to determine 2090 whether the two messages are either identical or similar. In an exemplary embodiment, memory controller 110 compares the two messages x and y bit-by-bit to determine whether the messages are identical or similar.

If memory controller 110 determines 2090 that the two messages x and y are neither similar nor identical, memory controller 110 stores 2100 message y in nonvolatile memory 130. If memory controller 110 determines 2090 that the two messages x and y are identical, memory controller 110 stores 2110 the physical address for message y as the physical address from message x in a logical-to-physical translation table. In an exemplary embodiment, the logical-to-physical table exists in a flash translation layer stored in RAM 120.

If memory controller 110 determines 2090 that the two messages x and y are similar, but not identical, memory controller 110 does not store message y in nonvolatile memory 130. Instead, memory controller 110 stores 2120 in nonvolatile memory 130 a pointer to the address of the similar message x. In an exemplary embodiment, the pointer is the logical address for message x contained in the entry (e.g., the pair (h, logical address)) of the deduplication table corresponding to message x. Additionally, memory controller 110 stores 2120 a representation of the difference (i.e., error) between the syndromes of messages x and y. In an exemplary embodiment, memory controller stores 2120 a compressed representation of the difference.

Figure 3:
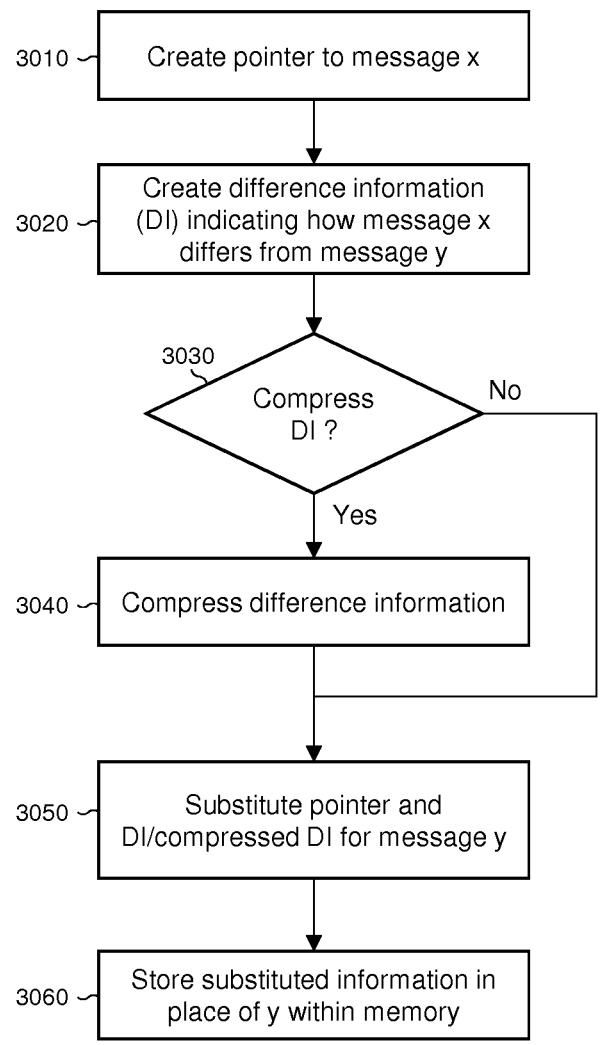
FIG. 3 illustrates a method of creating and storing pointer and difference information.

FIG. 3 illustrates, in greater detail, the method of creating and storing the pointer and difference information described above, in connection with FIG. 2. More specifically, FIG. 3 illustrates operation 2120, which is illustrated in FIG. 2, in greater detail. The method illustrated by FIG. 3 may be executed by memory controller 110, illustrated in FIG. 1.

Memory controller 110 creates 3010 a pointer to the memory location where message x is stored in nonvolatile memory 130. Additionally, memory controller 110 creates 3020 information identifying the difference between messages x and y. This difference information may be in the form of indices, as described above.

Memory controller 110 determines 3030 whether to apply a compression technique to the difference information. If so, memory controller 110 compresses 3040 the difference information and proceeds to operation 3050. Otherwise, memory controller 110 proceeds directly to operation 3050.

Memory controller 110 substitutes 3050 the created pointer and difference information, or the compressed version of the difference information, for message y and stores 3060 the substituted information in the storage location intended for message y within nonvolatile memory 130.

Figure 4:
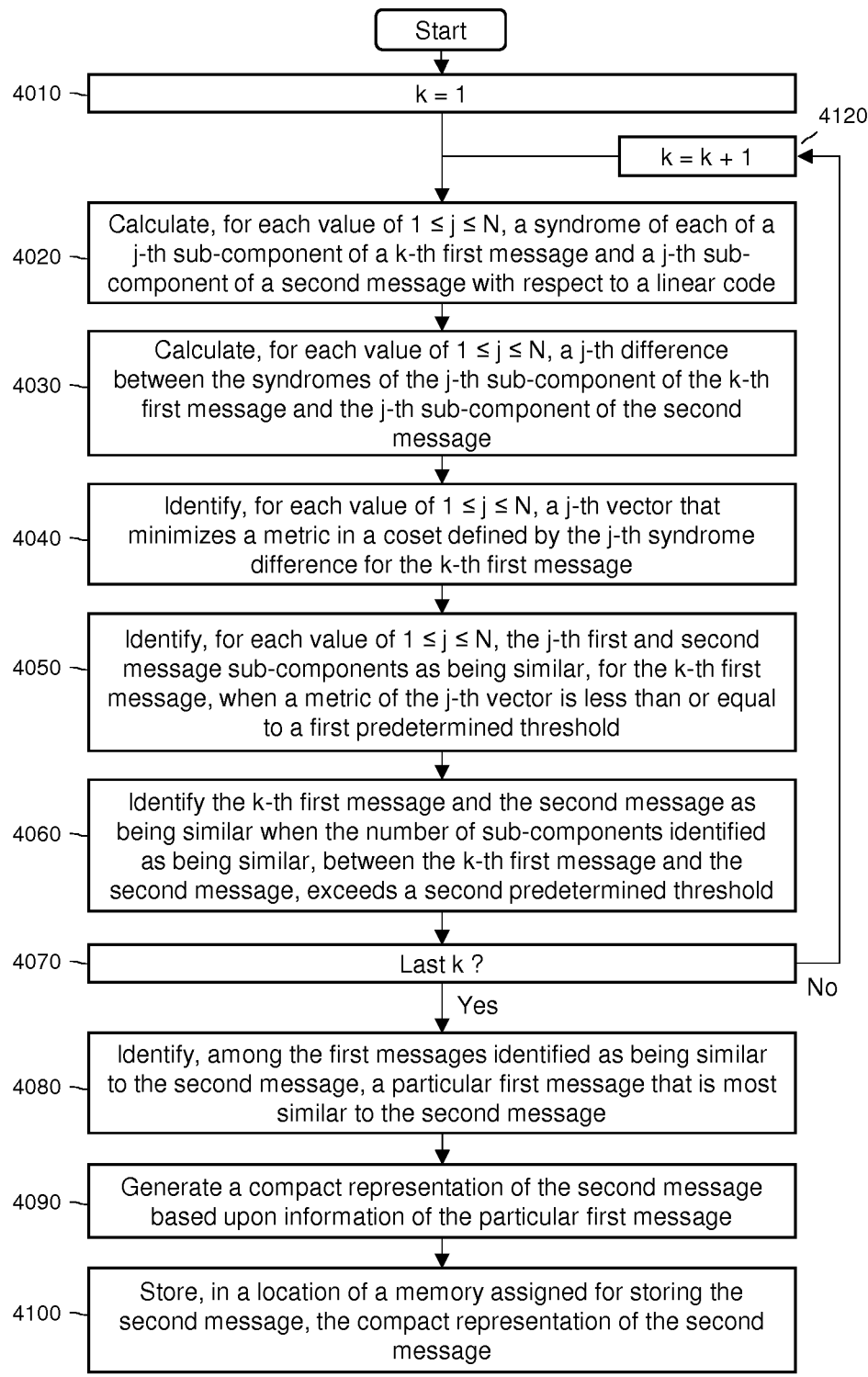
FIG. 4 illustrates a method for determining similarity between messages, which each has N sub-components, in accordance with another embodiment of the disclosure.

FIG. 4 illustrates a method for determining similarity between messages, each having N sub-components, in accordance with another embodiment of the disclosure. This method may be executed by memory controller 110, which is illustrated in FIG. 1.

According to the method illustrated by FIG. 4, memory controller 110 initializes 4010 a message index, k. In this example, message index k is initialized to a value of one. Memory controller 110 calculates 4020, for each value of $1 \leq j \leq N$, a syndrome of each of a $j^{th}$ sub-component of a $k^{th}$ first message and a syndrome of each of a $j^{th}$ sub-component of a second message with respect to a linear code. In this example, N may be an integer greater than one, j may be an integer, and k may be an integer greater than zero.

Memory controller 110 calculates 4030, for each value of $1 \leq j \leq N$, a $j^{th}$ difference between the syndromes of the $j^{th}$ sub-component of the $k^{th}$ first message and the $j^{th}$ sub-component of the second message. Memory controller 110 identifies 4040, for each value of $1 \leq j \leq N$, a $j^{th}$ vector that minimizes a metric in a coset defined by the $j^{th}$ syndrome difference for the $k^{th}$ first message. Subsequently, memory controller 110 identifies 4050, for each value of $1 \leq j \leq N$, the $j^{th}$ sub-component of the $k^{th}$ first message and the $j^{th}$ sub-component of the second message as being similar when a metric of the $j^{th}$ vector is less than or equal to a first predetermined threshold. And memory controller 110 identifies 4060 the $k^{th}$ first message and the second message as being similar when the number of sub-components identified as being similar between the $k^{th}$ first message and the second message exceeds a second predetermined threshold.

Memory controller 110 determines 4070 whether operations 4020 through 4060 are to be applied to another first message. If so, memory controller 110 changes 4120 message index k to identify another first message. In the illustrated example, memory controller 110 increments 4120 message index k by one and repeats operations 4020 through 4070 with respect to the particular first message identified by message index k. Thus, memory controller 110 performs operations 4020 through 4070 until all first messages available to memory controller 110 or the first messages selected by memory controller 110 have been compared to the second message.

Once all of the first messages to be compared to the second message have been so compared, as determined in operation 4070, memory controller 110 identifies 4080, among the first messages identified in operation 4060 as being similar to the second message, a particular first message that is more similar than others or most similar. Such identification may be based upon the number of first and second sub-message components identified as being similar in operation 4050. For example, if an $a^{th}$ first message and the second message have 3 similar sub-message components and a $b^{th}$ first message and the second message have 5 similar sub-message components, memory controller may select the $b^{th}$ first message, between the $a^{th}$ and $b^{th}$ first messages, as the particular first message most similar to the second message.

Memory controller 110 generates 4090 a compact representation of the second message that is based upon the particular first message. The compact representation of the second message may include a pointer to (e.g., the logical address of) the particular first message stored in nonvolatile memory 130 and a difference between the second message and the particular first message. Memory controller 110 may compress the determined difference within the compact representation of the second message. Memory controller 110 stores 4100 in a location of nonvolatile memory 130, assigned for storing the second message, the compact representation of the second message.

Operations of memory controller 110 may be executed, instead, by host 200. Each of host 200 and memory controller 110 may be an electronic processor, a computer, or an electronic circuit. The methods disclosed herein may be executed by memory controller 110 or host 200 according to instructions for implementing the methods that are stored within a non-transitory computer-readable medium. The computer-readable medium may be nonvolatile memory 130, RAM 120, or some other internal or external medium accessible to memory controller 110 or host 200.

A configuration illustrated in each conceptual diagram should be understood just from a conceptual point of view. Shape, structure, and size of each component illustrated in each conceptual diagram are exaggerated or downsized for understanding of the present disclosure. An actually implemented configuration may have a physical shape different from a configuration of each conceptual diagram. The present disclosure is not limited to a physical shape or size illustrated in each conceptual diagram.

The device configuration illustrated in each block diagram is provided to help convey an understanding of the present disclosure. Each block may include smaller blocks according to functions. Alternatively, a plurality of blocks may form a larger block according to a function. That is, the present disclosure is not limited to the components illustrated in each block diagram.

The operations illustrated in the drawings are illustrative of one or more embodiments of the disclosure, but are not limited to the sequence illustrated. Some operations may be omitted and additional operations may be included in embodiments of the disclosure. Also, the sequence of the operations may be changed and some operations may be performed either simultaneously or in sequence.

While the present disclosure has been particularly shown and described with reference to example embodiments thereof, the present disclosure is not limited to the above-described example embodiments. It will be understood by those of ordinary skill in the art that various changes and variations in form and details may be made therein without departing from the spirit and scope of the present disclosure as defined by the following claims.

All documents identified herein are hereby incorporated in their entireties by reference.

What is claimed is:

1. A method, executed by a processor, for determining similarity between messages, the method comprising:
    calculating a syndrome of each of first and second messages with respect to a linear code;
    calculating a difference between the syndromes of the first and second messages;
    identifying a vector that minimizes a metric in a coset defined by the syndrome difference;
    generating a compact representation of the second message that is based upon the first message, when a metric of the identified vector is less than or equal to a predetermined threshold; and
    storing in a location of a memory device assigned for storing the second message, when the metric of the identified vector is less than or equal to the predetermined threshold, the compact representation of the second message, thereby reducing used space in the memory device.

2. The method of claim 1, wherein the compact representation of the second message comprises a pointer to a storage location of the first message within the memory device.

3. The method of claim 2, wherein the compact representation of the second message further comprises information identifying a difference between the first and second messages.

4. The method of claim 3, wherein the information identifying the difference between the first and second messages is a set of indices identifying locations in which the second message differs from the first message.

5. The method of claim 3, wherein the information identifying the difference between the first and second messages is compressed by a compression algorithm prior to being stored in the memory location assigned for storing the second message.

6. The method of claim 1, wherein the metric in the coset defined by the syndrome difference is a Hamming weight.

7. The method of claim 1, wherein the metric in the coset defined by the syndrome difference is a burst length.

8. The method of claim 1, wherein the code is a Reed-Solomon code.

9. The method of claim 1, wherein the code is a Bose-Chaudhuri-Hocquenghem (BCH) code or Reed-Muller code.

10. An apparatus for executing de-duplication of similar messages, the apparatus comprising:
a memory that stores messages, including a first message; and
a memory controller that:
calculates a syndrome of each of the first message and a second message with respect to a linear code;
calculates a difference between the syndromes of the first and second messages;
identifies a vector that minimizes a metric in a coset defined by the syndrome difference; and
stores in a location of the memory assigned for storing the second message, when the metric of the identified vector is less than or equal to a predetermined threshold, a compact representation of the second message that is based upon the first message, thereby reducing used space in the memory.

11. The apparatus of claim 10, wherein the compact representation of the second message comprises a pointer to a storage location of the first message within the memory.

12. The apparatus of claim 10, wherein the compact representation of the second message comprises information identifying a difference between the first and second messages.

13. The apparatus of claim 12, wherein the information identifying the difference between the first and second messages is a set of indices identifying locations in which the second message differs from the first message.

14. The apparatus of claim 12, wherein the information identifying the difference between the first and second messages is compressed by a compression algorithm prior to being stored in the memory location assigned for storing the second message.

15. The apparatus of claim 10, wherein the metric in the coset defined by the syndrome difference is a Hamming weight.

16. The apparatus of claim 10, wherein the metric in the coset defined by the syndrome difference is a burst length.

17. The apparatus of claim 10, wherein the code is a Reed-Solomon code.

18. The apparatus of claim 10, wherein the code is a Bose-Chaudhuri-Hocquenghem (BCH) code or Reed-Muller code.

19. A method, executed by a processor, for determining similarity between messages, each of the messages having N sub-components, the method comprising:
a) calculating, for each value of $1 \leq j \leq N$, a syndrome of each of a $j^{th}$ sub-component of a $k^{th}$ first message and a $j^{th}$ sub-component of a second message with respect to a linear code, wherein N is an integer greater than one, j is an integer, and k is an integer greater than zero;
b) calculating, for each value of $1 \leq j \leq N$, a $j^{th}$ difference between the syndromes of the $j^{th}$ sub-component of the $k^{th}$ first message and the $j^{th}$ sub-component of the second message;
c) identifying, for each value of $1 \leq j \leq N$, a $j^{th}$ vector that minimizes a metric in a coset defined by the $j^{th}$ syndrome difference for the $k^{th}$ first message;
d) identifying, for each value of $1 \leq j \leq N$, the $j^{th}$ sub-component of the $k^{th}$ first message and the $j^{th}$ sub-component of the second message as being similar when a metric of the $j^{th}$ vector is less than or equal to a first predetermined threshold;
e) identifying the $k^{th}$ first message and the second message as being similar when the number of sub-components identified as being similar between the $k^{th}$ first message and the second message exceeds a second predetermined threshold;
f) generating a compact representation of the second message that is based upon the $k^{th}$ first message, when the $k^{th}$ first message and second message are identified as being similar and satisfy a predetermined degree of similarity; and
g) storing in a location of a memory assigned for storing the second message, when the $k^{th}$ first message and second message are identified as being similar and satisfy the predetermined degree of similarity, the compact representation of the second message, thereby reducing used space in the memory.

20. The method of claim 19, further comprising:
performing operations (a) through (e) for each of k>1 first messages, wherein
the $k^{th}$ first message and the second message satisfy the predetermined degree of similarity when the $k^{th}$ first message is no less similar to the second message than any of the other k−1 first messages.

* * * * *